(12) United States Patent
Colbeck

(10) Patent No.: US 7,592,844 B2
(45) Date of Patent: Sep. 22, 2009

(54) COMPARATOR WITH COMPLEMENTARY DIFFERENTIAL INPUT STAGES

(75) Inventor: Roger Colbeck, Ottawa (CA)

(73) Assignee: Power Integrations, Inc., San Jose, CA (US)

( * ) Notice: Subject to any disclaimer, the term of this patent is extended or adjusted under 35 U.S.C. 154(b) by 118 days.

(21) Appl. No.: 11/655,099

(22) Filed: Jan. 19, 2007

(65) Prior Publication Data
US 2008/0174342 A1 Jul. 24, 2008

(51) Int. Cl.
*H03K 5/22* (2006.01)
(52) U.S. Cl. .................................. 327/65; 330/251
(58) Field of Classification Search .................. 327/64, 327/65; 330/251
See application file for complete search history.

(56) References Cited

U.S. PATENT DOCUMENTS

| | | | | |
|---|---|---|---|---|
| 5,142,244 | A * | 8/1992 | Glica et al. .................. | 330/253 |
| 5,701,331 | A * | 12/1997 | Hunt ............................ | 375/316 |
| 5,764,086 | A * | 6/1998 | Nagamatsu et al. ........... | 327/65 |
| 5,889,419 | A * | 3/1999 | Fischer et al. ................. | 327/70 |
| 6,809,566 | B1 * | 10/2004 | Xin-LeBlanc ................ | 327/156 |
| 7,123,058 | B2 * | 10/2006 | Kim et al. ..................... | 327/90 |
| 7,230,485 | B2 * | 6/2007 | De Cremoux et al. ........ | 330/251 |
| 2004/0085097 | A1 | 5/2004 | Ta et al. | |
| 2004/0230388 | A1 * | 11/2004 | Kim et al. ..................... | 702/64 |
| 2005/0218938 | A1 * | 10/2005 | Sugano ......................... | 327/65 |
| 2006/0082392 | A1 | 4/2006 | Koo | |
| 2007/0057723 | A1 * | 3/2007 | Pan et al. ...................... | 330/252 |
| 2007/0115160 | A1 * | 5/2007 | Kleveland et al. ............ | 341/144 |
| 2007/0279125 | A1 * | 12/2007 | Tripathi et al. ............... | 327/563 |
| 2007/0285165 | A1 * | 12/2007 | Mukherjee et al. .......... | 330/253 |
| 2008/0018362 | A1 * | 1/2008 | Yu et al. ........................ | 327/65 |

FOREIGN PATENT DOCUMENTS

CA          1129505          8/1982

OTHER PUBLICATIONS

"Operational Amplifiers Rail to Rail Input Stages Using Complementary Differential Pairs" by A. Gharbiya, Nov. 15, 2002, submitted to Dr. K. Phang, University of Toronto.

(Continued)

*Primary Examiner*—Lincoln Donovan
*Assistant Examiner*—Ryan C Jager
(74) *Attorney, Agent, or Firm*—Blakely Sokoloff Taylor & Zafman LLP

(57) ABSTRACT

A comparator comprises complementary (e.g. NMOS and PMOS) comparator cells having overlapping common mode input voltage ranges which together extend approximately from rail to rail. A digital logic arrangement, including edge detectors, gates, and a latch, is responsive to transitions at the outputs of the comparator cells to set the latch in response to the earliest rising edge and to reset the latch in response to the earliest falling edge. An output of the latch constitutes an output of the comparator. Consequently the comparator is edge-sensitive with a speed optimized for a wide common mode input voltage range. Additional logic gates can provide level-sensitive control of the latch.

5 Claims, 2 Drawing Sheets

OTHER PUBLICATIONS

"A Compact Power-Efficient 3 V CMOS RAIL-TO-Rail Input/Output Operational Amplifier for VLSI Cell Libraries", R. Hogervorst, J.P. Tero, R.G.H. Eschauzier and J.H. Huijsing; IEEE Journal of Solid-State Circuits, vol. 29, No. 12, Dec. 1994; pp. 1505 to 1513.

International Search Report for International PCT Application No. PCT/CA2008/000083, Published on Apr. 29, 2008.

International Written Opinion of the International Searching for International PCT Application No. PCT/CA2008/000083, Published on Apr. 29, 2008.

\* cited by examiner

COMPARATOR WITH COMPLEMENTARY DIFFERENTIAL INPUT STAGES

This invention relates to comparators, and is particularly concerned with a comparator having complementary differential input stages, for example an NMOS differential input stage and a PMOS differential input stage, referred to below as dual input stages.

BACKGROUND

It is known to provide a comparator with dual input stages, for example NMOS and PMOS input stages in the case of a CMOS comparator, in order to provide the comparator with a wide common-mode input voltage range. For example in such a comparator with supply voltages of 0 and Vdd the NMOS input stage may have a common mode input voltage range from about 1V to near Vdd and the PMOS input stage may have a common mode input voltage range from near 0 to about Vdd−1V, so that (for voltages Vdd of at least about 2V) the dual input stages together can have a common mode input voltage range from near 0 to near Vdd, i.e. the rail to rail voltage range.

In such a known comparator outputs of the dual input stages are summed and amplified in an analog form, for example using current summation, to constitute an overall analog comparator. Such a comparator may have a relatively complex circuit and may constitute all of an IC (integrated circuit) which is dedicated to the function of a comparator.

In mixed signal and other ICs that may be desired for specific applications, for example for power control, it may be desired to provide one or more comparators with a wide common-mode input voltage range, for example near rail to rail, without involving the complexity and die area of a dedicated comparator circuit.

There is a need to provide such a comparator.

SUMMARY OF THE INVENTION

According to one aspect of this invention there is provided a comparator comprising: a first comparator cell responsive to a first range of input voltages for providing a first comparison signal; a second comparator cell responsive to a second range of input voltages, overlapping the first range, for providing a second comparison signal; and a logic arrangement responsive to the first and second comparison signals to provide a comparator output signal, the logic arrangement being responsive to a transition of the first comparison signal or a transition of the second comparison signal, whichever occurs first, representing a first change of comparison result to provide a first state of the comparator output signal, and being responsive to a transition of the first comparison signal or a transition of the second comparison signal, whichever occurs first, representing a second change of comparison result opposite to the first change to provide a second state of the comparator output signal opposite to said first state.

For example the first and second comparator cells can comprise differential input stages having opposite semiconductor types. In particular, in a CMOS implementation the first comparator cell can comprise an NMOS transistor differential input stage and the second comparator cell can comprise a PMOS transistor differential input stage.

In this case for example with supply voltages of 0V and a positive voltage Vdd, the first range of input voltages to which the NMOS transistor differential input stage is responsive can be a range from a voltage Vn above 0V to about Vdd, and the second range of input voltages to which the PMOS transistor differential input stage is responsive can be from about 0V to a voltage Vp less than Vdd, Vp being greater than Vn so that the first and second ranges overlap.

In one form of the comparator, the logic arrangement can comprise a latch providing an output of the comparator, at least one rising edge detector responsive to a transition of at least one of the first and second comparison signals representing said first change of comparison result to set a first state of the latch, and at least one falling edge detector responsive to a transition of at least one of the first and second comparison signals representing said second change of comparison result to produce a second state of the latch.

In a particular form of the comparator, the logic arrangement can comprise: a latch providing an output of the comparator; first and second rising edge detectors responsive to rising edges of the first and second comparison signals, respectively, to produce respective output pulses; a logic function for setting a first state of the latch in response to an output pulse from either of the rising edge detectors; first and second falling edge detectors responsive to falling edges of the first and second comparison signals, respectively, to produce respective output pulses; and a logic function for setting a second state of the latch in response to an output pulse from either of the falling edge detectors.

The logic arrangement can further include a logic function for setting the first state of the latch in response to a high level of both the first and second comparison signals, and a logic function for setting the second state of the latch in response to a low level of both the first and second comparison signals.

BRIEF DESCRIPTION OF THE DRAWINGS

The invention will be further understood from the following description by way of example with reference to the accompanying drawings, in which.

DETAILED DESCRIPTION

Figure 1:
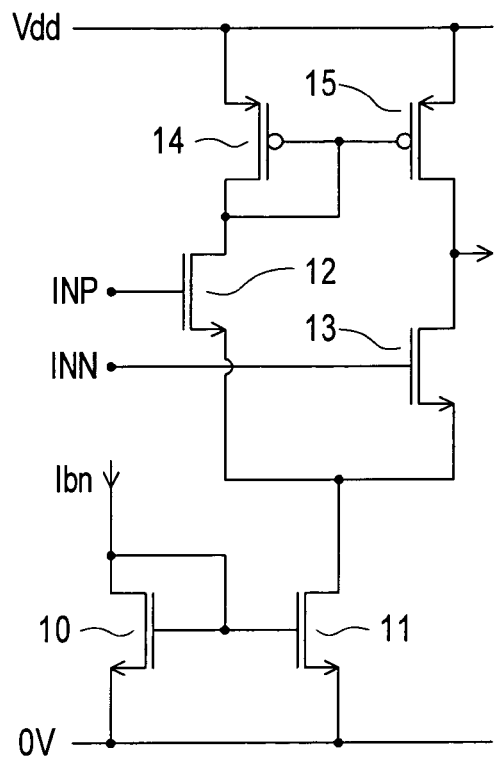
FIG. 1 schematically illustrates an input stage of a known NMOS comparator cell.

Referring to the drawings, FIG. 1 illustrates an input stage of a known NMOS comparator cell, comprising NMOS transistors 10 to 13 and PMOS transistors 14 and 15. The transistors 10 and 11 have their sources connected to a 0V supply voltage rail and their gates connected together and to the drain of the transistor 10. The drain of the transistor 10 is supplied with a bias current Ibn which accordingly is mirrored by the transistor 11. The transistors 12 and 13 have their gates connected to non-inverting and inverting inputs INP and INN respectively, their sources connected to the drain of the transistor 11, and their drains connected to the drains of the transistors 14 and 15 respectively. The transistors 14 and 15 have their gates connected together and to the drain of the transistor 14, and their sources connected to a supply voltage rail having a positive supply voltage Vdd. The transistors 14 and 15 form loads for the differentially-connected transistors 12 and 13 respectively. An output of the input stage of the comparator cell is taken from the drain of the transistor 13.

Figure 2:
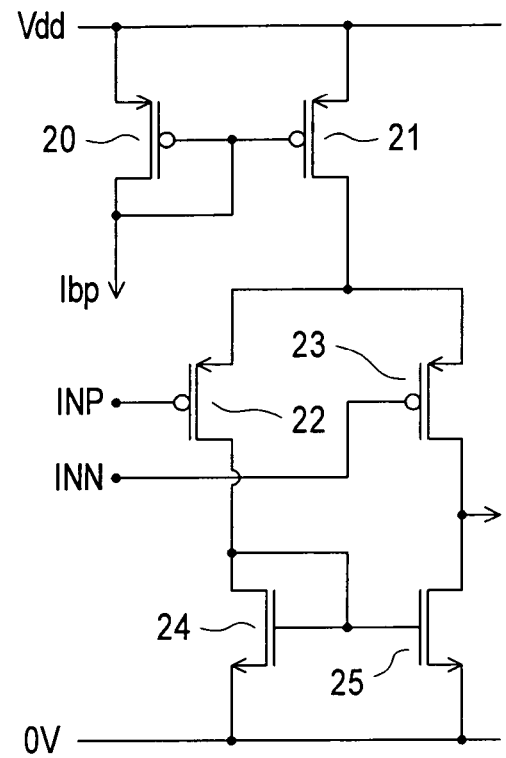
FIG. 2 schematically illustrates an input stage of a known PMOS comparator cell.

Conversely, FIG. 2 illustrates an input stage of a known PMOS comparator cell, comprising PMOS transistors 20 to 23 and NMOS transistors 24 and 25. The transistors 20 and 21 have their sources connected to the Vdd supply voltage rail and their gates connected together and to the drain of the transistor 20 A bias current Ibp flows from the drain of the transistor 20 and accordingly is mirrored by the transistor 21. The transistors 22 and 23 have their gates connected to non-inverting and inverting inputs INP and INN respectively, their sources connected to the drain of the transistor 21, and their drains connected to the drains of the transistors 24 and 25 respectively. The transistors 24 and 25 have their gates connected together and to the drain of the transistor 24, and their sources connected to the zero voltage rail at the voltage 0V. The transistors 24 and 25 form loads for the differentially-connected transistors 22 and 23 respectively. An output of the input stage of the comparator cell is taken from the drain of the transistor 23.

Figure 3:
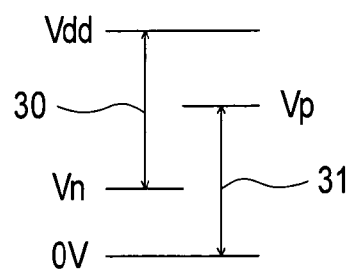
FIG. 3 is a diagram illustrating common mode input voltage ranges for the comparator cell input stages of FIGS. 1 and 2.

FIG. 3 illustrates the overlapping common mode input voltage ranges 30 and 31 of comparator cells having the input stages of FIGS. 1 and 2 respectively. As shown in FIG. 3, the common mode input voltage range 30 for the input stage of FIG. 1 for the NMOS comparator cell is from a positive voltage Vn above 0V to about the positive supply voltage Vdd, and the common mode input voltage range 31 for the input stage of FIG. 2 for the PMOS comparator cell is from about 0V to a positive voltage Vp less than the supply voltage Vdd. For example, with Vdd of the order of 3.0 or 3.3V, Vn may be about 1.0V and Vp may be about Vdd−1.0V.

The values of Vn and Vp may vary with manufacturing process, supply voltage, and temperature variations, and with any particular required response speed of the comparator cells. For example, the input stage of FIG. 1 may produce an output signal for some common mode input voltages less than Vn, but in this case may provide an undesirably slow response.

Figure 4:
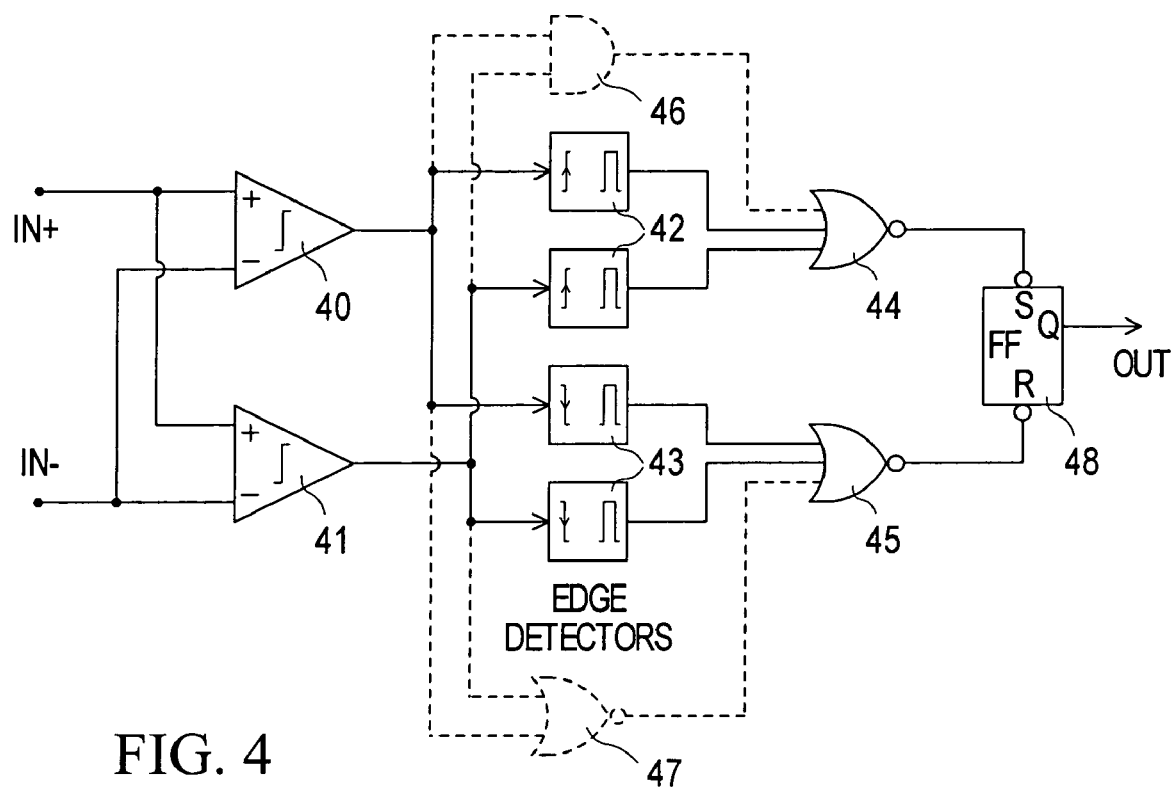
FIG. 4 schematically illustrates a comparator in accordance with an embodiment of the invention.

FIG. 4 schematically illustrates a CMOS comparator in accordance with an embodiment of the invention. The example CMOS comparator comprises an NMOS comparator cell 40, a PMOS comparator cell 41, and a logic arrangement coupled to outputs of the comparator cells 40 and 41. The logic arrangement provides a comparator output signal on an output line OUT. The logic arrangement in this embodiment of the invention comprises two rising edge detectors 42, two falling edge detectors 43, two NOR gates 44 and 45, and a set-reset latch or flip-flop (FF) 48 which produces the comparator output signal at its Q output. The comparator of FIG. 4 also includes a two-input AND gate 46 and a two-input NOR gate 47. As described below, these need not necessarily be provided and can be omitted. The gates 46 and 47 and their connections are shown by dashed lines in FIG. 4 to indicate that these are optional.

The NMOS comparator cell 40 has a non-inverting (+) input connected to a non-inverting input IN+ of the comparator of FIG. 4, and an inverting (−) input connected to an inverting input IN− of the comparator of FIG. 4. This NMOS comparator cell 40 can for example have an input stage as described above with reference to FIG. 1, the inputs INP and INN constituting the non-inverting and inverting inputs, respectively, of the comparator cell 40.

Similarly, the PMOS comparator cell 41 has a non-inverting (+) input connected to the non-inverting input IN+ of the comparator of FIG. 4, and an inverting (−) input connected to the inverting input IN− of the comparator of FIG. 4. This PMOS comparator cell 41 can for example have an input stage as described above with reference to FIG. 2, the inputs INP and INN constituting the non-inverting and inverting inputs, respectively, of the comparator cell 41.

Consequently, the comparator cells 40 and 41 of the comparator of FIG. 4 constitute dual input stages for which, as described above with reference to FIG. 3, the common mode input voltage range can extend approximately from rail to rail, i.e. from about 0V to about Vdd.

The output of the comparator cell 40 is connected to an input of one of the rising edge detectors 42, to an input of one of the falling edge detectors 43, and to one input of each of the AND gate 46 and the NOR gate 47 if these are present. Similarly, the output of the comparator cell 41 is connected to an input of the other of the rising edge detectors 42, to an input of the other of the falling edge detectors 43, and to the other input of each of the gates 46 and 47 if these are present.

The outputs of the two rising edge detectors 42, and the output of the AND gate 46 if this is present, are connected to respective inputs of the NOR gate 44, whose output is connected to an active-low set input S of the latch 48. The outputs of the two falling edge detectors 43, and the output of the NOR gate 47 if this is present, are connected to respective inputs of the NOR gate 45, whose output is connected to an active-low reset input R of the latch 48.

Each of the falling edge detectors 43 serves to produce a short positive-going output pulse in response to a falling edge supplied to its input, as shown diagrammatically within each block 43 in FIG. 4. To this end, each of the falling edge detectors 43 can have any desired form, one example of which is shown in FIG. 5.

Figure 5:
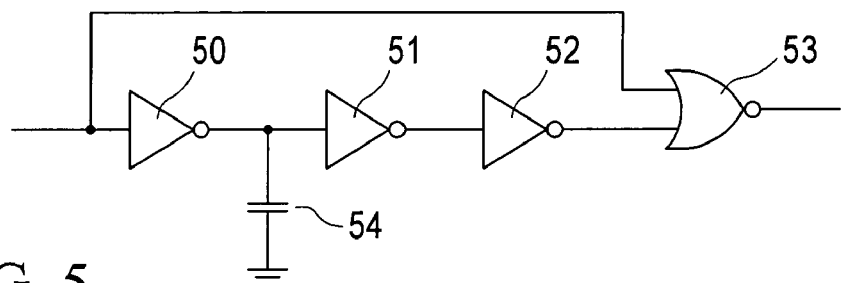
FIG. 5 schematically illustrates one form of falling edge detector of the comparator of FIG. 4.

Referring to FIG. 5, each falling edge detector 43 can for example comprise three inverters 50, 51, and 52 connected in succession. An output of the third inverter 52 is connected to one input of a two-input NOR gate 53 whose output constitutes the output of the falling edge detector. An input of the first inverter 50 constitutes the input of the falling edge detector and is also connected to the other input of the NOR gate 53. A capacitance 54 is connected to ground, or 0V, from a junction between the output of the first inverter 50 and the input of the second inverter 51. The output of the second inverter 51 is connected to the input of the third inverter 52. The capacitance 54 can comprise the gate capacitance of a transistor having its source and drain connected to ground, as described further below.

A falling edge of a digital signal at the input of the falling edge detector of FIG. 5 results in a more slowly rising signal at the output of the inverter 50 as the capacitance 54 is charged to Vdd by the limited drive current of the inverter 50, thereby producing a rising edge at the output of the inverter 52 after a short delay dependent upon this drive current and the magnitude of the capacitance 54. Consequently, the NOR gate 53 produces at its output a positive-going pulse (output~Vdd) having the same duration as this delay period.

Conversely, each of the rising edge detectors 42 serves to produce a short positive-going output pulse in response to a rising edge supplied to its input, as shown diagrammatically within each block 42 in FIG. 4. To this end, each of the rising edge detectors 42 can have any desired form, one example of which is shown in FIG. 6.

Figure 6:
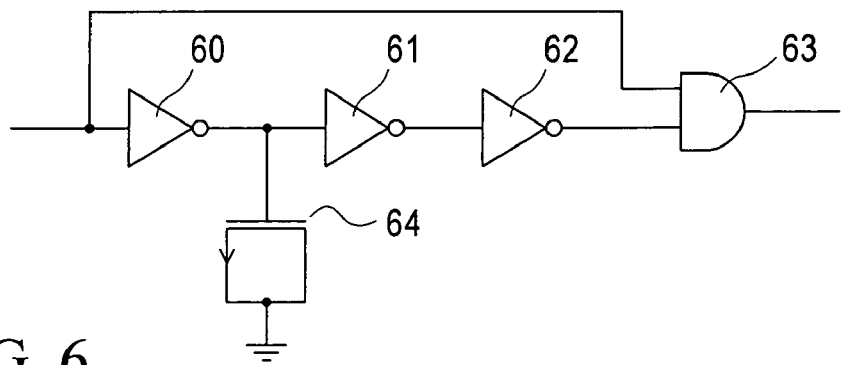
FIG. 6 schematically illustrates one form of rising edge detector of the comparator of FIG. 1.

Referring to FIG. 6, each rising edge detector 42 can for example comprise three inverters 60, 61, and 62 connected in succession. An output of the third inverter 62 is connected to one input of a two-input AND gate 63 whose output constitutes the output of the rising edge detector. An input of the first inverter 60 constitutes the input of the rising edge detector and is also connected to the other input of the AND gate 63. A capacitance to ground, or 0V, from a junction between the output of the first inverter 60 and the input of the second inverter 61 is constituted by a transistor 64 having its gate connected to this junction and its source and drain connected to ground. The output of the second inverter 61 is connected to the input of the third inverter 62.

A rising edge of a digital signal at the input of the rising edge detector of FIG. 6 results in a more slowly falling signal at the output of the inverter 60 as the capacitance provided by the transistor 64 is discharged to 0V by the limited output sink current of the inverter 60, thereby producing a falling edge at the output of the inverter 62 after a short delay dependent upon this sink current and the magnitude of the capacitance. Consequently, the AND gate 63 produces at its output a positive-going pulse (output~Vdd) having the same duration as this delay period.

The transistor 64 can be replaced by any other form of capacitance, or the capacitance 54 in the falling edge detector of FIG. 5 can be constituted by a transistor connected in a similar manner to the transistor 64 in the rising edge detector of FIG. 6, as may be desired.

Referring again to FIG. 4, for example a change at the inputs IN+ and IN− which causes the voltage at the input IN+ to cross and rise above the voltage at the input IN− will produce a positive edge or transition at the output of one or both of the comparator cells 40 and 41. Whether or not each individual comparator cell produces such a transition at its output, and the response speed of the comparator cell and hence the delay in producing such a transition, will depend upon, among other things, the common mode input voltages relative to the ranges 30 and 31 as shown in FIG. 3.

In any event, at least one of the comparator cells 40 and 41 will produce a rising edge at its output, resulting in a pulse being produced at the output of at least one of the rising edge detectors 42. In response to such a pulse, or the earliest of such pulses, the NOR gate 44 produces a low output signal that sets the latch 48 via the active-low set input S, thereby producing a high level at the Q output of the latch 48 and hence at the output of the comparator of FIG. 4.

Conversely, if the input voltages change so that the voltage at the input IN+ crosses and falls below the voltage at the input IN−, depending upon the input voltages one or both of the comparator cells 40 and 41 produces a falling edge that is detected by the respective falling edge detector 43, producing a low output of the gate 45 which resets the latch 48 to produce a low level at the output.

The provision of both the NMOS comparator cell 40 and the PMOS comparator cell 41 ensures that the comparator of FIG. 4 has a wide, approximately rail to rail, common mode input voltage range. The provision of the rising and falling edge detectors 42 and 43 and the associated logic arrangement as described above ensures that the comparator of FIG. 4 provides an optimum response speed. If both of the comparator cells 40 and 41 produce output transitions in response to a change in input conditions, then the output of the comparator of FIG. 4 changes in response to whichever of the two comparator cells 40 and 41 responds first, thereby maximizing the comparator response speed.

Without the gates 46 and 47, the comparator of FIG. 4 is edge sensitive and, depending on initial startup conditions, may not operate correctly in response to purely static input signals. With the gates 46 and 47 also present as shown in FIG. 4, the comparator is also level sensitive, at least over most of the input voltage ranges shown in FIG. 3. Thus for example a high output of both of the comparator cells 40 and 41 produces a high output of the gate 46, thereby setting the latch 48 to produce a high output of the comparator of FIG. 4. Conversely, a low output of both of the comparator cells 40 and 41 produces a high output of the gate 47, thereby resetting the latch 48 to produce a low output of the comparator of FIG. 4.

The logic arrangement of FIG. 4 uses only simple elements such as inverters, gates, and a set-reset latch which, along with the NMOS and PMOS comparator cells 40 and 41, are standard components of a typical library for CMOS design. The entire comparator of FIG. 4 can thus be designed and implemented in a very simple and convenient manner, using a relatively small die area, in comparison to the relatively complex design and implementation, and relatively large die area, of a dedicated rail to rail comparator.

Although a particular form of the logic arrangement is described above, it can be appreciated that the logic arrangement may have any other desired form for responding, for changes in the input voltages, in each case to the earliest transition at the output of one of the comparator cells 40 and 41. For example, the latch 48 could instead be set and reset in response to signals derived by differentiating signals at the outputs of the comparator cells 40 and 41 to respond to the respective transitions, and appropriately combining the differentiated signals. Further, the functions of the edge detectors and logic gates can be combined and rearranged, for example combining the outputs of the comparator cells 40 and 41 prior to any edge detection so that only two edge detectors, one for rising edges and one for falling edges, are required.

Although a CMOS comparator is described above, the invention is not limited in this respect and other embodiments of the invention may use other technologies. For example, the comparator cells can comprise differential input stages using NPN and PNP bipolar transistors instead of NMOS and PMOS transistors, respectively.

In addition, although as described above the comparator provides an approximately rail to rail common mode input voltage range, this need not necessarily be the case and embodiments of the invention may be used anywhere that it is desired to extend the input voltage range of the comparator beyond that of a single NMOS or PMOS comparator cell, or to enhance the response speed of the comparator relative to that of a single NMOS or PMOS comparator cell for any given input voltage.

For example, in a power control IC it may be desired to compare a voltage with a linear ramp in order to determine a switching time. Such an IC may be implemented using a CMOS process which limits the supply voltage (Vdd) to 3.0 or 3.3V. For maximizing resolution and dynamic range, in this case the linear ramp may have a range of 0.5 to 2.5V that is not rail to rail (0V to Vdd) but extends beyond the individual ranges 30 and 31 shown in FIG. 3. A single NMOS or PMOS comparator cell is not sufficient to provide this input voltage range with a sufficient comparator speed for all process, voltage, and temperature variations, but a comparator such as that of FIG. 4 can.

Thus although a particular embodiment of the invention is described above by way of example, it can be appreciated that numerous modifications, variations, and adaptations may be made without departing from the scope of the invention as defined in the claims.

The invention claimed is:

1. A comparator comprising:
    a pair of inputs;
    a first comparator cell coupled to the pair of inputs and responsive to a first range of input voltages for providing a first comparison signal;
    a second comparator cell coupled to the pair of inputs and responsive to a second range of input voltages, overlapping the first range, for providing a second comparison signal; and
    a logic arrangement responsive to the first and second comparison signals to provide a comparator output signal, the logic arrangement being responsive to a transition of the first comparison signal or a transition of the second comparison signal, whichever occurs first, representing a first change of comparison result to provide a first state of the comparator output signal, and being responsive to a transition of the first comparison signal or a transition of the second comparison signal, whichever occurs first, representing a second change of comparison result opposite to the first change to provide a second state of the comparator output signal opposite to said first state, wherein the logic arrangement comprises a latch providing an output of the comparator, at least one rising edge detector responsive to a transition of at least one of the first and second comparison signals representing said first change of comparison result to set a first state of the latch, and at least one falling edge detector responsive to a transition of at least one of the first and second comparison signals representing said second change of comparison result to produce a second state of the latch, wherein the logic arrangement further includes a logic function for setting the first state of the latch in response to a high level of both the first and second comparison signals, and a logic function for setting the second state of the latch in response to a low level of both the first and second comparison signals.

2. A comparator as claimed in claim 1 wherein the first and second comparator cells comprise differential input stages having opposite semiconductor types.

3. A comparator as claimed in claim 1 wherein the first comparator cell comprises an NMOS transistor differential input stage and the second comparator cell comprises a PMOS transistor differential input stage.

4. A comparator comprising:

a pair of inputs;

a first comparator cell coupled to the pair of inputs and responsive to a first range of input voltages for providing a first comparison signal;

a second comparator cell coupled to the pair of inputs and responsive to a second range of input voltages, overlapping the first range, for providing a second comparison signal; and a logic arrangement responsive to the first and second comparison signals to provide a comparator output signal, the logic arrangement being responsive to a transition of the first comparison signal or a transition of the second comparison signal, whichever occurs first, representing a first change of comparison result to provide a first state of the comparator output signal, and being responsive to a transition of the first comparison signal or a transition of the second comparison signal, whichever occurs first, representing a second change of comparison result opposite to the first change to provide a second state of the comparator output signal opposite to said first state, wherein the logic arrangement comprises:

a latch providing an output of the comparator;

first and second rising edge detectors responsive to rising edges of the first and second comparison signals, respectively, to produce respective output pulses;

a logic function for setting a first state of the latch in response to an output pulse from either of the rising edge detectors;

first and second falling edge detectors responsive to falling edges of the first and second comparison signals, respectively, to produce respective output pulses; and a logic function for setting a second state of the latch in response to an output pulse from either of the falling edge detectors.

5. A comparator as claimed in claim 4 wherein the logic arrangement further includes a logic function for setting the first state of the latch in response to a high level of both the first and second comparison signals, and a logic function for setting the second state of the latch in response to a low level of both the first and second comparison signals.

* * * * *